United States Patent
Kim et al.

(10) Patent No.: US 7,453,528 B2
(45) Date of Patent: Nov. 18, 2008

(54) PLASMA DISPLAY APPARATUS

(75) Inventors: Guy-Seong Kim, Suwon-si (KR); Won-Kyu Bang, Suwon-si (KR)

(73) Assignee: Samsung Co., Ltd., Suwon (KR)

( * ) Notice: Subject to any disclaimer, the term of this patent is extended or adjusted under 35 U.S.C. 154(b) by 449 days.

(21) Appl. No.: 11/130,102

(22) Filed: May 17, 2005

(65) Prior Publication Data

US 2005/0264982 A1    Dec. 1, 2005

(30) Foreign Application Priority Data

May 18, 2004    (KR) .................... 10-2004-0035138

(51) Int. Cl.
    G02F 1/13        (2006.01)
(52) U.S. Cl. .............. 349/1; 349/58; 361/679; 361/681
(58) Field of Classification Search ........ 349/1, 349/58; 361/679, 681
    See application file for complete search history.

(56) References Cited

U.S. PATENT DOCUMENTS

| 6,847,415 | B1 * | 1/2005 | Yoshimura et al. ......... 349/58 |
| 7,262,552 | B2 * | 8/2007 | Nomoto et al. ............. 313/582 |
| 2004/0252254 | A1 * | 12/2004 | Koo et al. .................... 349/58 |
| 2005/0180098 | A1 * | 8/2005 | Kim ............................ 361/681 |

FOREIGN PATENT DOCUMENTS

| CN | 2092849 | 1/1992 |
| CN | 1463417 | 12/2003 |
| JP | 61-027389 | 2/1986 |
| JP | 62-110981 | 7/1987 |
| JP | 62-116588 | 7/1987 |
| JP | 01-274496 | 11/1989 |
| JP | 03-053881 | 5/1991 |
| JP | 04-352393 | 12/1992 |
| JP | 06-017286 | 3/1994 |
| JP | 07-045972 | 2/1995 |
| JP | 07-297572 | 11/1995 |
| JP | 07297573 A1 | 11/1995 |
| JP | 08-056085 | 2/1996 |
| JP | 09-190861 | 7/1997 |
| JP | 09-246761 | 9/1997 |
| JP | 2000-133955 | 5/2000 |
| JP | 2001-022281 | 1/2001 |
| JP | 2001-056703 | 2/2001 |
| JP | 2002-123178 | 4/2002 |
| JP | 2002-223084 | 8/2002 |
| KR | 2019980027245 U | 8/1998 |
| KR | 10-2004-0024401 | 3/2004 |

* cited by examiner

*Primary Examiner*—David C. Nelms
*Assistant Examiner*—Thanh-Nhan P Nguyen
(74) *Attorney, Agent, or Firm*—H.C. Park & Associates, PLC (57) ABSTRACT

There is provided a plasma display apparatus capable of reducing the cost and complexity of fitting circuit boards to a chassis base. The plasma display apparatus comprises a plasma display panel (PDP), a chassis base having a first side attached to the PDP, the first side also supporting the PDP, and circuit boards provided at a second side of the chassis base opposite to the first side attached to the PDP. The chassis base has at least one boss and at least one supporter disposed thereon, which correspond to holes disposed in a circuit board.

20 Claims, 9 Drawing Sheets

PLASMA DISPLAY APPARATUS

CROSS-REFERENCE TO RELATED APPLICATION

This application claims priority to and the benefit of Korean Patent Application No. 10-2004-0035138 filed in the Korean Intellectual Property Office on May 18, 2004, which is incorporated herein by reference.

BACKGROUND OF THE INVENTION (a) Field of the Invention

The present invention relates to a plasma display apparatus, and more particularly, to a plasma display apparatus in which various circuit boards can be effectively fixed to a chassis base.

(b) Description of the Related Art

It is well-known that a plasma display panel (PDP) forms images by exciting phosphors with vacuum ultraviolet rays caused by gas discharge from discharge cells. The PDP provides excellent display capacity, brightness, contrast and viewing angle, and can be used in a large-sized screen of minimal thickness and weight.

A plasma display apparatus employing such a PDP further comprises a chassis base having a first side supporting the plasma display panel, circuit boards fixed to the chassis base on a second side opposite to the first side supporting the PDP, and a case, which surrounds the PDP, chassis base, and circuit boards, and provides an outer appearance for the plasma display apparatus.

The case has a front cover positioned at the front side of the PDP and a rear cover positioned at the back side of the PDP. In general, the front cover and the rear cover are detachable from each other.

The circuit boards fixed to the chassis base include, for example, a power supply board, an image processing board, a logic board, an address buffer board, a sustain-electrode driving board, and a scan-electrode driving board. The boards are fixed to corresponding bosses on the chassis base with setscrews, and are connected to electrodes of the PDP through electrical connection means such as flexible printed circuits (FPC), which drive the PDP.

Since the chassis base has a large number of bosses, a large number of setscrews are required for fitting the circuit boards to the chassis base, thereby increasing manufacturing costs. In addition, since a large number of setscrews need to be handled, the manufacturing process is complex and productivity is decreased.

SUMMARY OF THE INVENTION

The present invention provides a plasma display apparatus that reduces the cost and complexity of fitting circuit boards to a chassis base.

According to an embodiment of the present invention, a plasma display apparatus is provided, which includes: a PDP; a chassis base having a first side attached to the PDP, the first side also supporting the PDP; and circuit boards provided at a second side of the chassis base opposite to the first side attached to the PDP, wherein the chassis base has at least one boss and at least one supporter disposed thereon, for fixing and supporting a circuit board, that correspond with holes disposed in the circuit board

DETAILED DESCRIPTION

Hereinafter, exemplary embodiments of the present invention will be described in detail with reference to the accompanying drawings.

Figure 1:
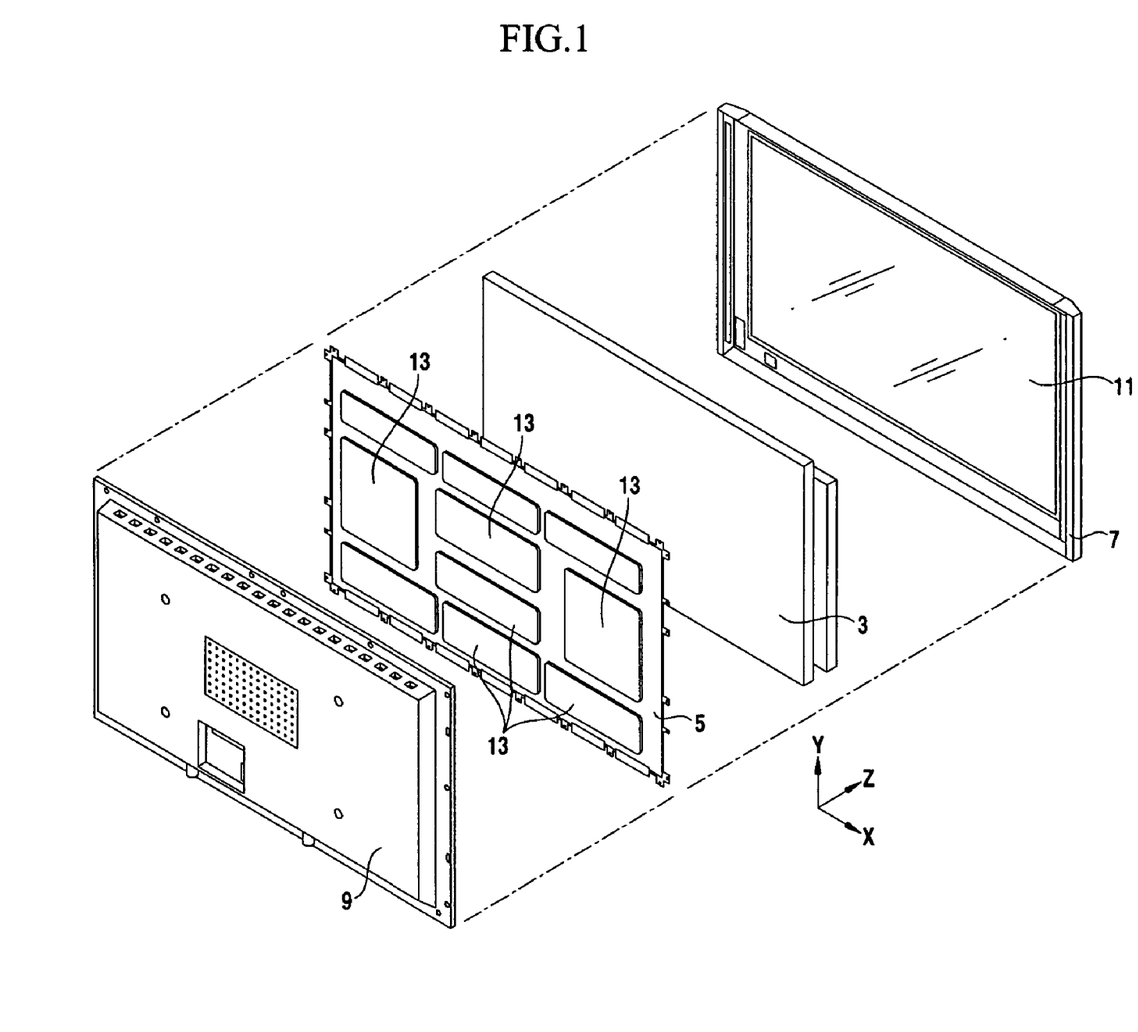
FIG. 1 is an exploded perspective view illustrating a plasma display apparatus according to an embodiment of the present invention.
Figure 2:
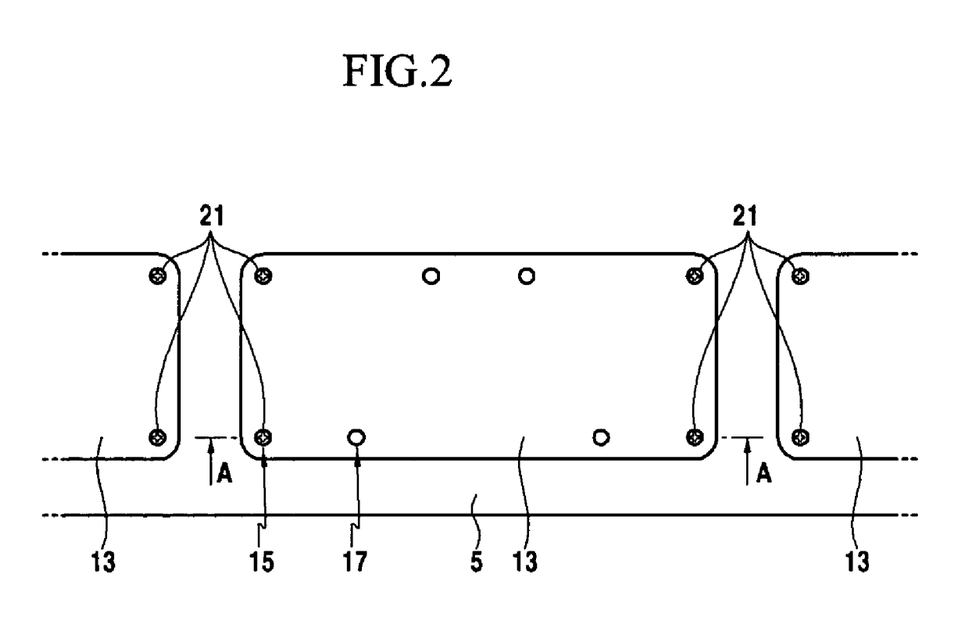
FIG. 2 is a partial plan view illustrating a chassis base and circuit boards of the plasma display apparatus according to an embodiment of the present invention.

Referring to FIG. 1, a plasma display apparatus according to the present invention comprises a PDP 3 for substantially forming images and a chassis base 5, which is coupled to PDP 3 at a rear side that is opposite to a front side on which images are formed. The plasma display apparatus further comprises a front cover 7 disposed at the front side of PDP 3 and a rear cover 9 disposed at the rear side of chassis base 5.

A heat dissipating sheet (not shown) for transferring heat generated from PDP 3 to chassis base 5 may be disposed between PDP 3 and chassis base 5. A filter 11 that intercepts electromagnetic waves emitted from PDP 3 may be fixed to front cover 7.

PDP 3 generally has a substantially rectangular shape (i.e., wherein the X axial length is larger than the Y axial length, as shown in FIG. 1). Chassis base 5 has a shape corresponding to the shape of PDP 3 and is made of a material having an excellent thermal conductivity, such as, for example, aluminum.

One front side of chassis base 5 is provided with PDP 3 and the other rear side is provided with a plurality of circuit boards 13 necessary for driving PDP 3. The circuit boards 13 are fixed, substantially by use of setscrews (not shown), to a plurality of bosses (not shown) provided on the rear side of chassis base 5.

The circuit boards 13 fixed onto the rear side of chassis base 5 include a sustain-electrode driving board, a scan-electrode driving board, an image processing board and a switching mode power supply (SMPS) board. It is well-known that circuit boards 13 are formed by mounting various devices (not shown), such as field effect transistors (not shown), on a printed circuit board with lead lines.

Looking at FIGS. 2, 3, 4, and 5, chassis base 5 has bosses 15 and supporters 17 that correspond to holes in circuit boards 13 so as to fit and support them. The circuit boards 13 include boards performing various functions as described above but an address buffer board is exemplified in FIGS. 2 and 3. The present invention, however, can be applied to other boards similarly.

That is, circuit boards 13 are primarily fixed to chassis base 5 by first placing circuit boards 13 on bosses 15 and supporters 17 and then inserting setscrews 21 into holes 13a of the circuit boards 13 to fasten the circuit boards 13 to bosses 15. Circuit boards 13 are secondarily supported by supporters 17.

Decreasing the number of bosses 15 can decrease a corresponding number of setscrews 21, thereby reducing the complexity of fitting circuit boards 13 to chassis base 5. Bosses 15 may be provided at various positions on chassis base 5. It is preferable, however, that bosses 15 are disposed at positions where the circuit boards 13 can be simply fixed to specific positions of the chassis base 5, i.e., at positions that correspond to the edges of circuit boards 13.

Taking into consideration that circuit boards 13 have substantially rectangular shapes, bosses 15 may be disposed on chassis base 5 at positions that correspond to the corners of circuit boards 13. Such an arrangement of bosses 15 can fix the circuit boards 13 with greater stability and decrease the number of setscrews 21 required.

Figure 3:
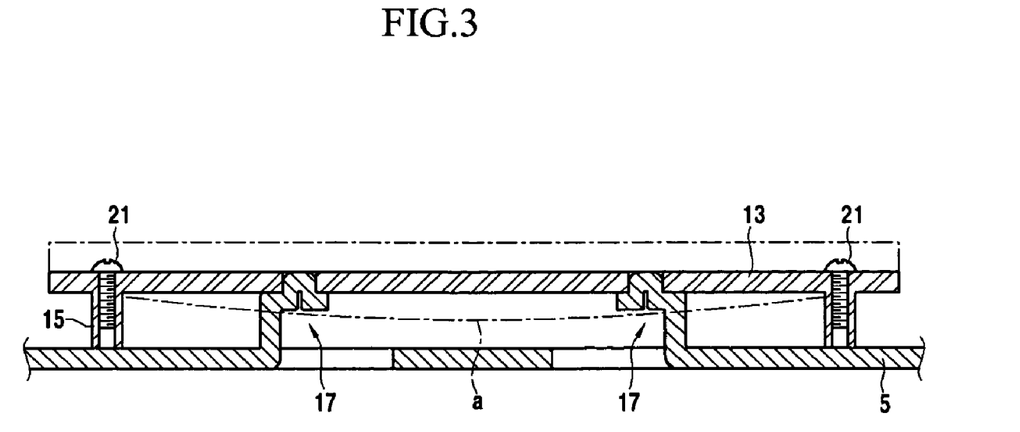
FIG. 3 is a cross-sectional view taken along Line A-A of FIG. 2.

In circuit boards 13 that are fixed to chassis base 5 by setscrews 21 in bosses 15 disposed at the corners or edges of circuit boards 13, gaps between bosses 15 may cause the circuit boards 13 to sag between bosses 15 if these gaps are too large, as shown in the curve indicated by a virtual line (a) in FIG. 3.

In order to prevent the sag of circuit boards 13, supporters 17 are provided to have a structure protruding from the chassis base 5 between bosses 15. Supporters 17 may be formed only at the positions where curving of circuit boards 13 can occur, or may be formed at proper intervals between bosses 15 so as to support several positions of respective circuit boards 13.

Supporters 17 may be formed to have a structure for simply supporting the circuit boards 13, but it is more preferable that supporters 17 are formed to have a structure capable of preventing the circuit boards 13 from shifting in a direction parallel to the plane of chassis base 5. In the present embodiment of the invention, a structure of a supporter 17 is shown that can prevent circuit boards 13 from shifting in the direction parallel to the plane of chassis base 5, as well as enhance the fastening power of setscrews 21, in addition to supporting circuit boards 13.

Figure 4:
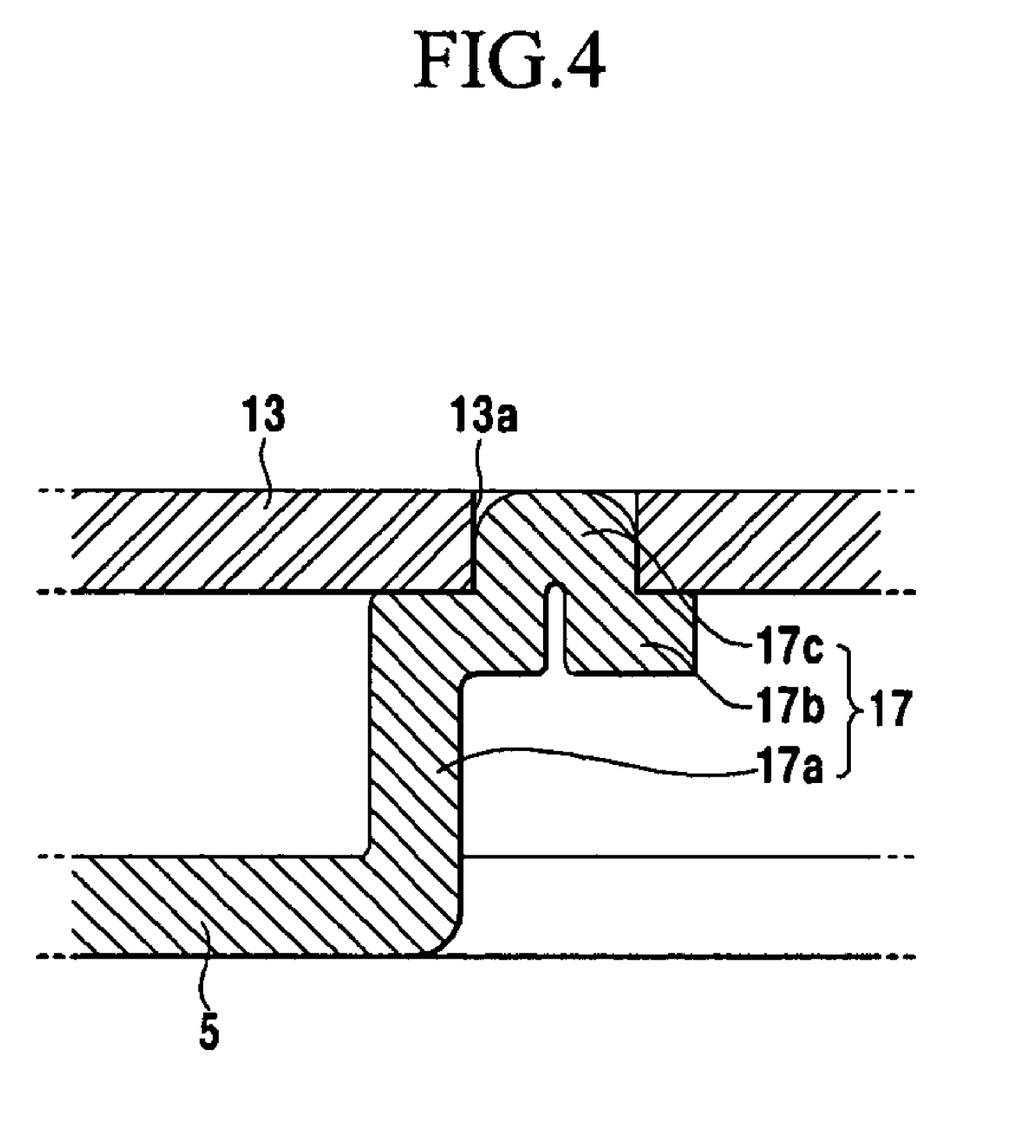
FIG. 4 is a partially-enlarged cross-sectional view illustrating a supporter of the plasma display apparatus according to an embodiment of the present invention.
Figure 5:
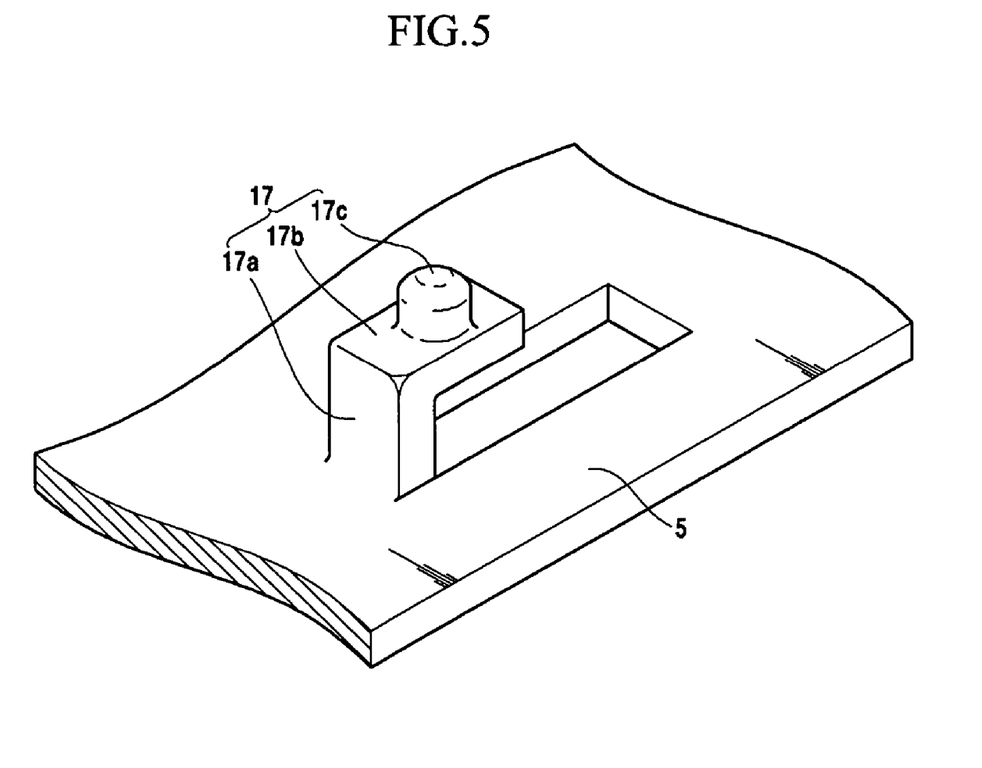
FIG. 5 is a perspective view illustrating the supporter of the plasma display apparatus according to an embodiment of the present invention.

Referring to FIGS. 4 and 5, each supporter 17 comprises a vertical portion 17a and a horizontal portion 17b. Vertical portion 17a is formed integrally with the chassis base 5, by slitting the chassis base 5 and bending the slit piece away from the rear side of chassis base 5. As a result, vertical portion 17a is perpendicular to the plane of chassis base 5. Horizontal portion 17b is then formed by bending the tip of vertical portion 17a so that it is parallel to the plane of chassis base 5. Horizontal portion 17b comes in direct contact with circuit boards 13. Therefore, it is preferable that the total height of vertical portion 17a and horizontal portion 17b is equal to the height of bosses 15, thereby supporting the circuit boards 13 on a plane parallel to the plane of chassis base 5. Horizontal portions 17b support the surfaces of circuit boards 13 that oppose chassis base 5, thereby preventing circuit boards 13 from sagging between bosses 15.

Horizontal portion 17b may be formed in a flat shape so as to merely support the circuit boards 13, or may further have a projection 17c for preventing circuit boards 13 from shifting in the direction parallel to the plane of chassis base 5. In this case, of course, holes 13a, into which projections 17c can be inserted, are provided in circuit boards 13.

Projection 17c may have various shapes. In FIGS. 4 and 5, a projection 17c is shown that protrudes from horizontal portion 17b in the longitudinal direction of vertical portion 17a. Projection 17c can be formed by pressing, or stamping, horizontal portion 17b. As a result, circuit boards 13 can be stably supported by flat surfaces of horizontal portion 17b that are positioned at the sides of projection 17c, while maintaining the coupling of holes 13a and projections 17c.

Figure 6:
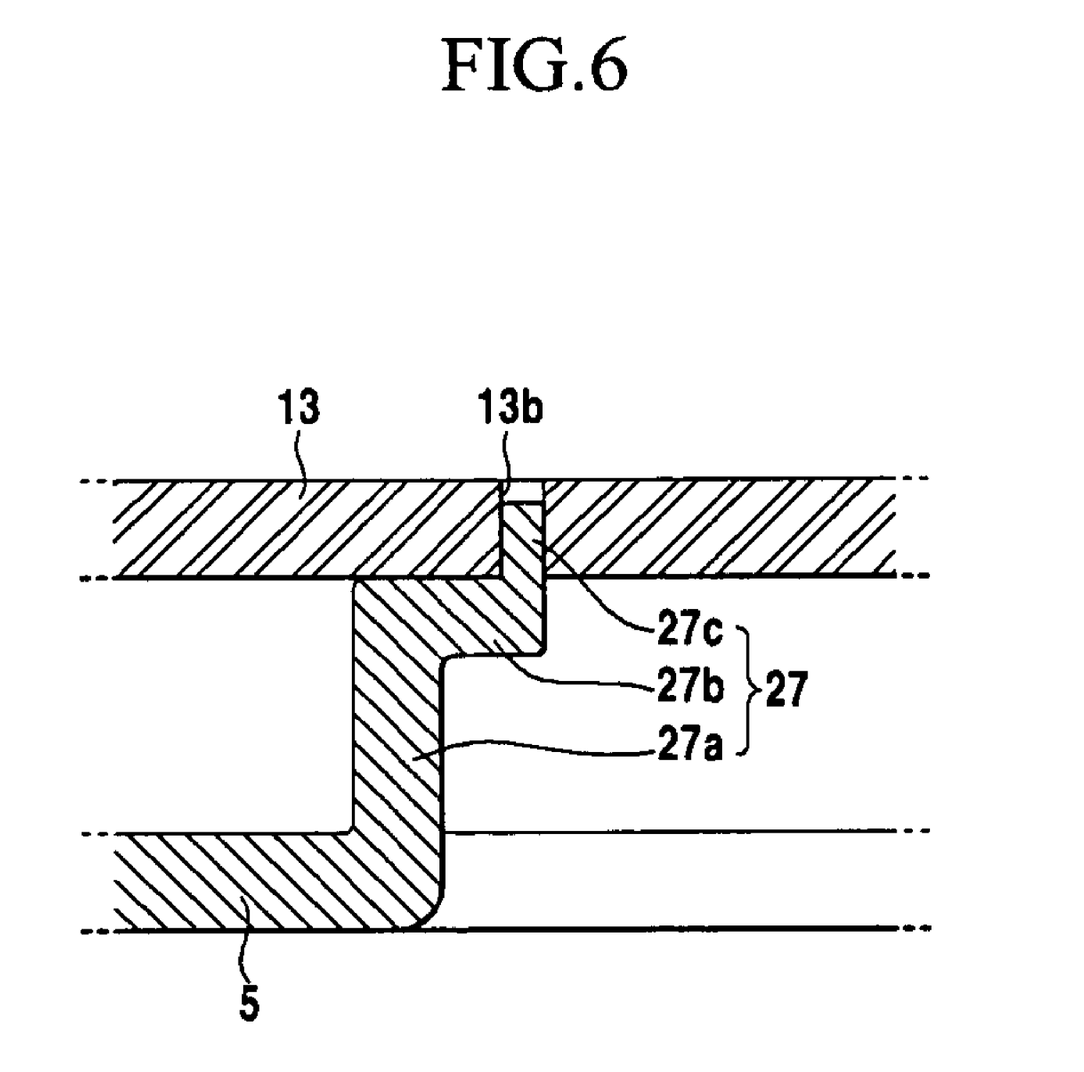
FIG. 6 is a partially-enlarged cross-sectional view illustrating a supporter of a plasma display apparatus according to a second embodiment of the present invention.
Figure 7:
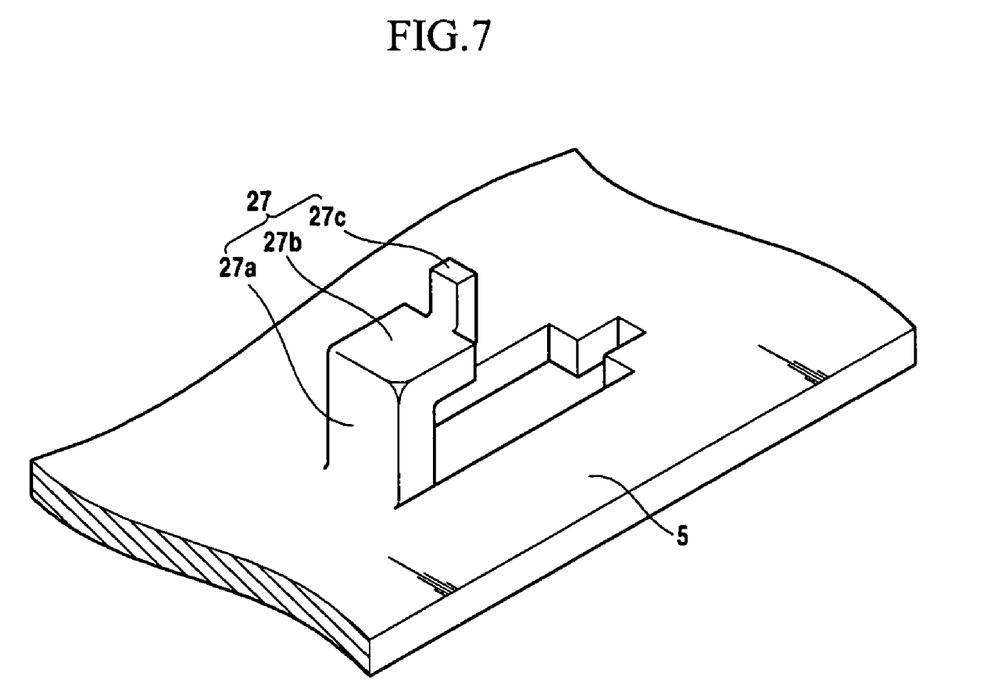
FIG. 7 is a perspective view illustrating the supporter of the plasma display apparatus according to another embodiment of the present invention.

Referring to FIG. 6 and FIG. 7, supporter 27 according to the another embodiment of the invention comprises a vertical portion 27a, a horizontal portion 27b, and a projection 27c having a shape different from that of projection 17c, which was previously described.

Projection 27c is formed by bending the tip of horizontal portion 27b in the longitudinal direction of vertical portion 27a. It is preferable that projection 27c has a width less than that of horizontal portion 27b so as to perform the same function as projection 17c.

It is also preferable that projections 17c and 27c are forcibly inserted into and coupled to holes 13a and 13b, respectively, of circuit boards 13.

One or more supporters 17 and 27 can be provided between bosses 15. When the gap between bosses 15 is large enough to cause circuit boards 13 to sag, an even number of supporters 17 and 27 can be provided between bosses 15.

In this case, it is preferable that supporters 17 and 27 are symmetrically arranged on chassis base 5. That is, since the supporters 17 and 27 are bent as described above, they can apply a force toward one supporter 17 or 27 when the supporters 17 and 27 are not bent accurately in the horizontal and vertical directions during the manufacturing process thereof. A symmetrical arrangement of supporters 17 and 27 can cancel this force. That is, the vertical portion and the horizontal portion of one supporter 17 or 27 form a symmetric structure along with the vertical portion and the horizontal portion of the adjacent supporter 17 or 27.

When the number of supporters 17 and 27 is odd, an even number of supporters 17 and 27 may be symmetrically arranged and the remaining supporter 17 or 27 may be disposed on chassis base 5 in a suitable location.

Figure 8:
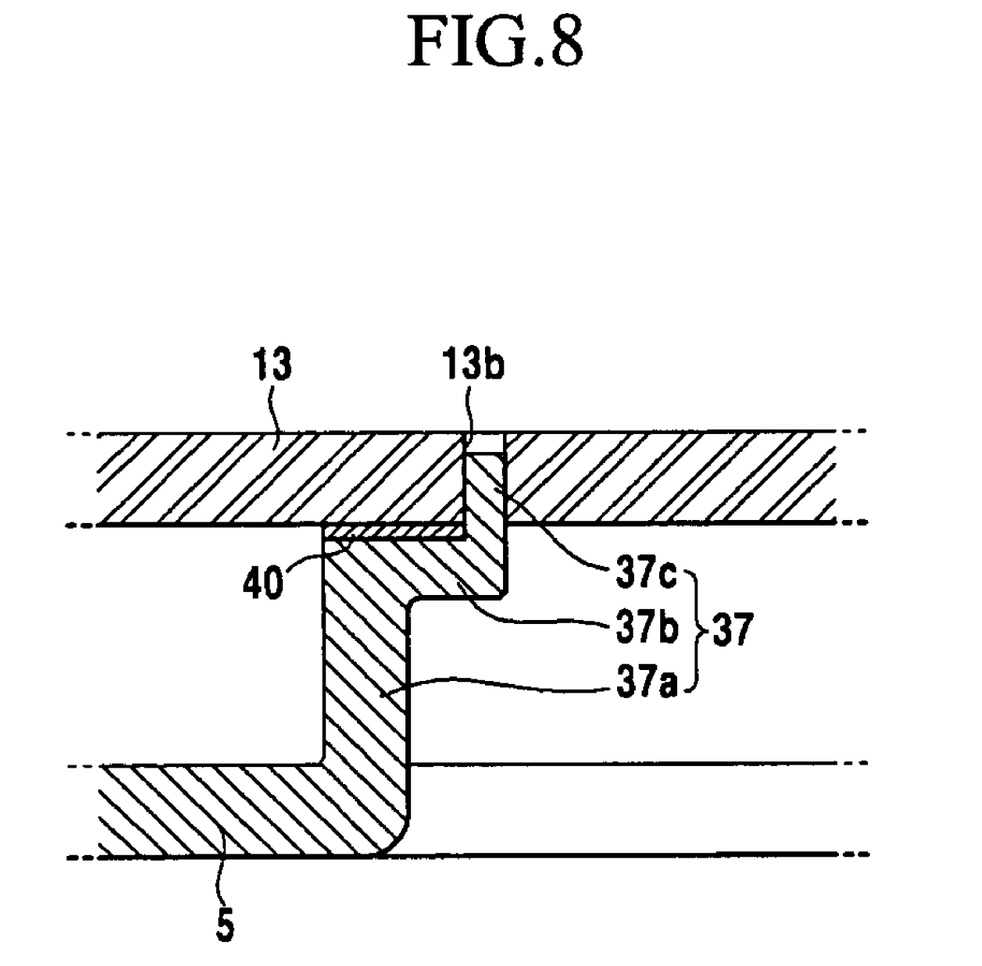
FIG. 8 is a partially-enlarged cross-sectional view illustrating a supporter of a plasma display apparatus according to a yet another embodiment of the present invention.
Figure 9:
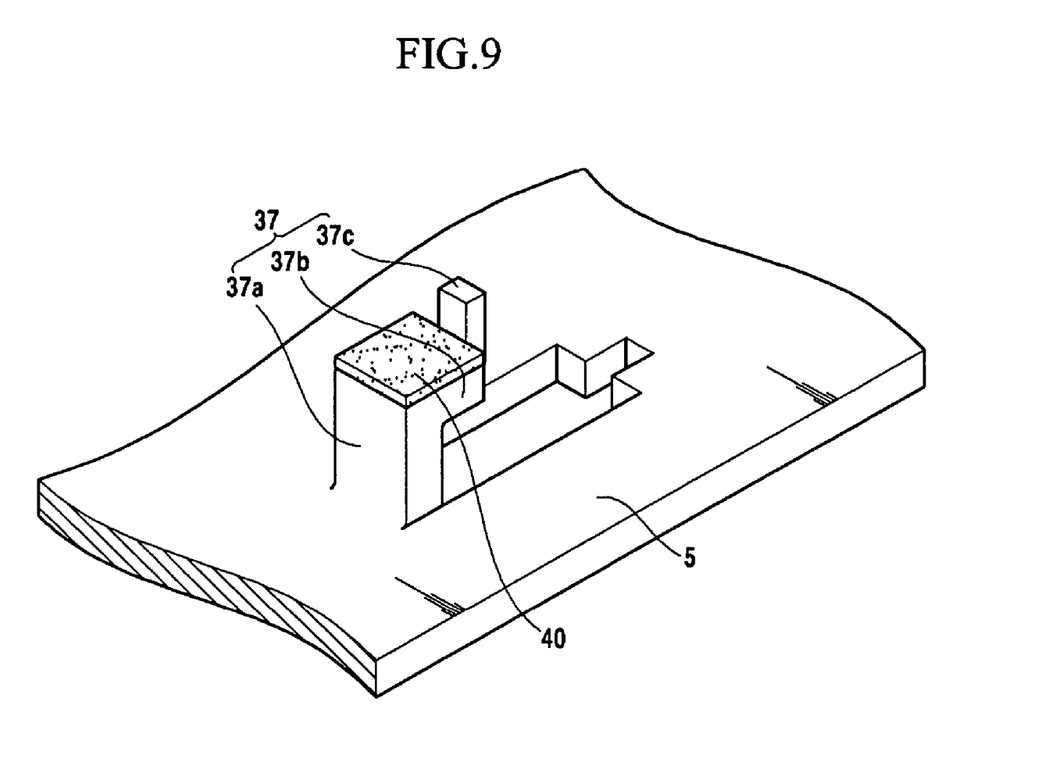
FIG. 9 is a perspective view illustrating the supporter of the plasma display is apparatus according to yet another embodiment of the present invention.

Referring to FIGS. 8 and 9, supporter 37 according to yet another embodiment of the invention comprises a vertical portion 37a, a horizontal portion 37b, and a projection 37c, which is formed by bending the tip of horizontal portion 37b, in a similar manner as supporter 27. Supporter 37 further comprises a vibration-proof pad 40 provided on horizontal portion 37b. Vibration-proof pad 40, which suppresses the occurrence of noise due to vibration of circuit boards 13 or chassis base 5, is interposed between circuit boards 13 and the surface of supporter 37 that contacts the circuit boards.

Vibration-proof pad 40 may be also formed on the horizontal portion 17b of the supporter 17.

Although a number of exemplary embodiments of the present invention have been described, the present invention is not limited to these embodiments, but may be modified in various forms without departing from the scope of the appended claims, the detailed description, and the accompanying drawings of the present invention. Therefore, it is natural that such modifications are within the scope of the present invention.

What is claimed is:

1. A plasma display apparatus, comprising:
   a plasma display panel;
   a chassis base having a first side attached to the plasma display panel, wherein the first side of the chassis base also supports the plasma display panel; and
   a circuit board disposed on a second side of the chassis base opposite to the first side,
   wherein the chassis base has at least one boss and at least one supporter disposed on the second side that correspond to holes disposed on the circuit board, the at least one boss and the at least one supporter to fix and support the circuit board with the chassis base, and
   wherein the at least one supporter supports the circuit board in a plane parallel with the chassis base without a setscrew.

2. The plasma display apparatus of claim 1, wherein the circuit board is placed on the second side of the chassis base such that the holes align with the at least one boss and the at least one supporter, the circuit board is fixed to the chassis base with a setscrew inserted into the at least one boss, and the circuit board is supported by the at least one supporter.

3. The plasma display apparatus of claim 1, wherein the at least one boss is disposed proximate to an edge of the circuit board.

4. The plasma display apparatus of claim 1, wherein the circuit board is a substantially rectangular shape and the at least one boss is disposed proximate to a corner of the circuit board.

5. The plasma display apparatus of claim 1, wherein the at least one supporter is disposed between at least one pair of bosses.

6. The plasma display apparatus of claim 1, wherein the number of supporters provided between a pair of bosses is even, and the supporters are disposed in a symmetrical arrangement.

7. A plasma display apparatus, comprising:
   a plasma display panel;
   a chassis base having a first side attached to the plasma display panel, wherein the first side supports the plasma display panel; and
   a circuit board disposed on a second side of the chassis base opposite to the first side,
   wherein the chassis base comprises a boss and a supporter disposed on the second side and corresponding to holes disposed on the circuit board, the boss and the supporter to fix and support the circuit board with the chassis base, and
   wherein the supporter has a vertical portion formed integrally with the chassis base and a horizontal portion formed by bending a tip of the vertical portion.

8. The plasma display apparatus of claim 7, wherein the supporter is formed by slitting the chassis base.

9. The plasma display apparatus of claim 7, wherein the horizontal portion has a projection disposed in a first hole of the circuit board.

10. The plasma display apparatus of claim 9, wherein the projection protrudes from the horizontal portion in the longitudinal direction of the vertical portion.

11. The plasma display apparatus of claim 9, wherein the projection is formed by bending the tip of the horizontal portion in the longitudinal direction of the vertical portion.

12. The plasma display apparatus of claim 11, wherein the projection has a width less than that of the horizontal portion.

13. The plasma display apparatus of claim 9, wherein the projection is forcibly inserted into the first hole of the circuit board.

14. The plasma display apparatus of claim 7, wherein a vibration-proof pad is provided on the horizontal portion of the supporter and is interposed between the supporter and the circuit board.

15. The plasma display apparatus of claim 7, wherein the number of supporters provided between a pair of bosses is even, and the vertical and horizontal portions of one supporter and the vertical and horizontal portions of another supporter adjacent thereto are disposed in a symmetrical arrangement.

16. The plasma display apparatus of claim 7, wherein the circuit board is disposed on the second side of the chassis base such that the holes align with the boss and the supporter, the circuit board is fixed to the chassis base with a setscrew inserted into the boss, and the circuit board is supported by the supporter.

17. The plasma display apparatus of claim 7, wherein the boss is disposed proximate to an edge of the circuit board.

18. The plasma display apparatus of claim 7, wherein the circuit board is a substantially rectangular shape and the boss is disposed proximate to a corner of the circuit board.

19. The plasma display apparatus of claim 7, wherein the supporter is disposed between two bosses of the chassis base.

20. The plasma display apparatus of claim 7, wherein the number of supporters provided between two bosses is even, and the supporters are disposed in a symmetrical arrangement.

* * * * *